United States Patent
Steur et al.

(10) Patent No.: US 12,474,645 B2
(45) Date of Patent: Nov. 18, 2025

(54) OBJECT TABLE, STAGE APPARATUS, HOLDING METHOD AND LITHOGRAPHIC APPARATUS

(71) Applicant: ASML NETHERLANDS B.V., Veldhoven (NL)

(72) Inventors: Michael Marinus Anna Steur, Eindhoven (NL); Bas Jansen, Rosmalen (NL); Andre Bernardus Jeunink, De Lutte (NL); Johannes Adrianus Cornelis Maria Pijnenburg, Moergestel (NL)

(73) Assignee: ASML NETHERLANDS B.V., Veldhoven (NL)

( * ) Notice: Subject to any disclaimer, the term of this patent is extended or adjusted under 35 U.S.C. 154(b) by 283 days.

(21) Appl. No.: 18/027,343

(22) PCT Filed: Sep. 27, 2021

(86) PCT No.: PCT/EP2021/076500
§ 371 (c)(1),
(2) Date: Mar. 20, 2023

(87) PCT Pub. No.: WO2022/078743
PCT Pub. Date: Apr. 21, 2022

(65) Prior Publication Data
US 2023/0400783 A1 Dec. 14, 2023

(30) Foreign Application Priority Data
Oct. 16, 2020 (EP) ..................................... 20202316

(51) Int. Cl.
*G03F 7/00* (2006.01)

(52) U.S. Cl.
CPC ................................ *G03F 7/70716* (2013.01)

(58) Field of Classification Search
CPC ............. G03F 7/70716; G03F 7/70708; G03F 7/70733; G03F 7/707; H01L 21/6833; H01L 21/6875
See application file for complete search history.

(56) References Cited

U.S. PATENT DOCUMENTS

| 6,020,964 A | 2/2000 | Loopstra et al. |
| 6,313,567 B1 | 11/2001 | Maltabes et al. |

(Continued)

FOREIGN PATENT DOCUMENTS

| TW | 201348107 | 12/2013 |
| WO | 2008/156366 | 12/2008 |

(Continued)

OTHER PUBLICATIONS

International Search Report and Written Opinion issued in corresponding International Application No. PCT/EP2021/076500 dated Dec. 16, 2021.

(Continued)

*Primary Examiner* — Hung V Nguyen
(74) *Attorney, Agent, or Firm* — Pillsbury Winthrop Shaw Pittman, LLP

(57) ABSTRACT

An object table including: a holding surface for holding an object; and an actuator arrangement configured to exert a holding force on the object for holding the object to the holding surface, wherein the actuator arrangement is further configured to decrease a strain in the object caused by the holding force by sequentially detaching and re-attaching portions of the object from the holding surface, while the object is held to the holding surface.

20 Claims, 11 Drawing Sheets

(56) References Cited

U.S. PATENT DOCUMENTS

| | | | |
|---|---|---|---|
| 6,556,281 | B1 | 4/2003 | Govil et al. |
| 6,952,253 | B2 | 10/2005 | Lof et al. |
| 10,896,843 | B2 * | 1/2021 | Sato .................. H01J 37/3171 |
| 11,004,686 | B2 * | 5/2021 | Mitsuishi .............. H01L 23/544 |
| 2003/0176079 | A1 | 9/2003 | Sogard |
| 2004/0248391 | A1 | 12/2004 | Elyaakoubi et al. |
| 2007/0058173 | A1 | 3/2007 | Holzapfel |
| 2011/0236162 | A1 | 9/2011 | Shikayama et al. |
| 2012/0180475 | A1 * | 7/2012 | Shimizu ................ F03G 7/0121 60/530 |
| 2013/0100572 | A1 | 4/2013 | Shu |
| 2013/0100573 | A1 | 4/2013 | Shu |
| 2014/0320841 | A1 * | 10/2014 | Muraki ............... G03F 7/70708 355/73 |
| 2016/0370712 | A1 | 12/2016 | Shibazaki |
| 2019/0043749 | A1 | 2/2019 | Jeunnik et al. |
| 2019/0113853 | A1 | 4/2019 | Onvlee et al. |
| 2020/0027768 | A1 | 1/2020 | Zinner et al. |
| 2020/0043860 | A1 | 2/2020 | Sugaya et al. |
| 2020/0286851 | A1 | 9/2020 | Mitsuishi et al. |

FOREIGN PATENT DOCUMENTS

| | | |
|---|---|---|
| WO | 2016/062540 | 4/2016 |
| WO | 2019/096554 | 5/2019 |
| WO | 2020/179716 | 9/2020 |

OTHER PUBLICATIONS

M. Steur, "Design of an Active Wafer Clamp for Wafer Machines", Eindhoven University of Technology, Thesis, ISBN: 978-90-386-4360-1 (2017).

Anonymous, "Wafer warp prevention and correction through mechanical stress compensation", Research Disclosure, No. 622019 (Jan. 11, 2016).

* cited by examiner

OBJECT TABLE, STAGE APPARATUS, HOLDING METHOD AND LITHOGRAPHIC APPARATUS

This application is the U.S. national phase entry of PCT Patent Application No. PCT/EP2021/076500 filed on Sep. 27, 2021, which claims the benefit of priority of European Patent Application No. 20202316.4 filed on Oct. 16, 2020.

FIELD

The present invention relates to an object table as can be applied to hold a semiconductor substrate or a patterning device, a holding method, a stage apparatus and a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

Semiconductor circuits manufactured according to the above described lithographic patterning process are typically build-up of a plurality of layers, e.g. 20 or more layers. In order to ensure proper operation of the semiconductor circuits, these layers have to be accurately aligned. In particular, patterns of consecutive layers should be accurately aligned in order for the semiconductor circuit or device to properly operate. In order to ensure such alignment, one needs to ensure that the substrate is suitably held, or clamped, onto the substrate table during the exposure or patterning process. At the same time, care should be taken that the substrate should not deform, since such a deformation may also render it difficult to align a patterned radiation beam to a previously applied pattern. A possible source of deformation of the substrate can be the process of clamping the substrate to the substrate table. In particular, in case of warped substrates, the clamping process has been found to introduce deformations of the substrate. Such deformations may thus render it difficult to achieve a desired alignment accuracy between consecutive layers.

SUMMARY

It is an object of the present invention to enable a clamping or holding of an object such as a substrate or patterning device in such manner that occurring deformations caused by the clamping or holding process are mitigated. According to an aspect of the invention, there is provided an object table comprising:
  a holding surface for holding an object;
  an actuator arrangement configured to exert a holding force on the object for holding the object to the holding surface;
  whereby the actuator arrangement is further configured to decrease a strain in the object caused by the holding force by sequentially detaching and re-attaching portions of the object from the holding surface, while the object is held to the holding surface.

According to a further aspect of the present invention, there is provided a method of holding an object to a holding surface of an object table, the method comprising:
  providing an object table having a holding surface for holding an object;
  exerting a holding force on the object to hold the object to the holding surface;
  decreasing a strain in the object caused by the holding force by sequentially detaching and re-attaching portions of the object from the holding surface, while the object is held to the holding surface.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultraviolet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
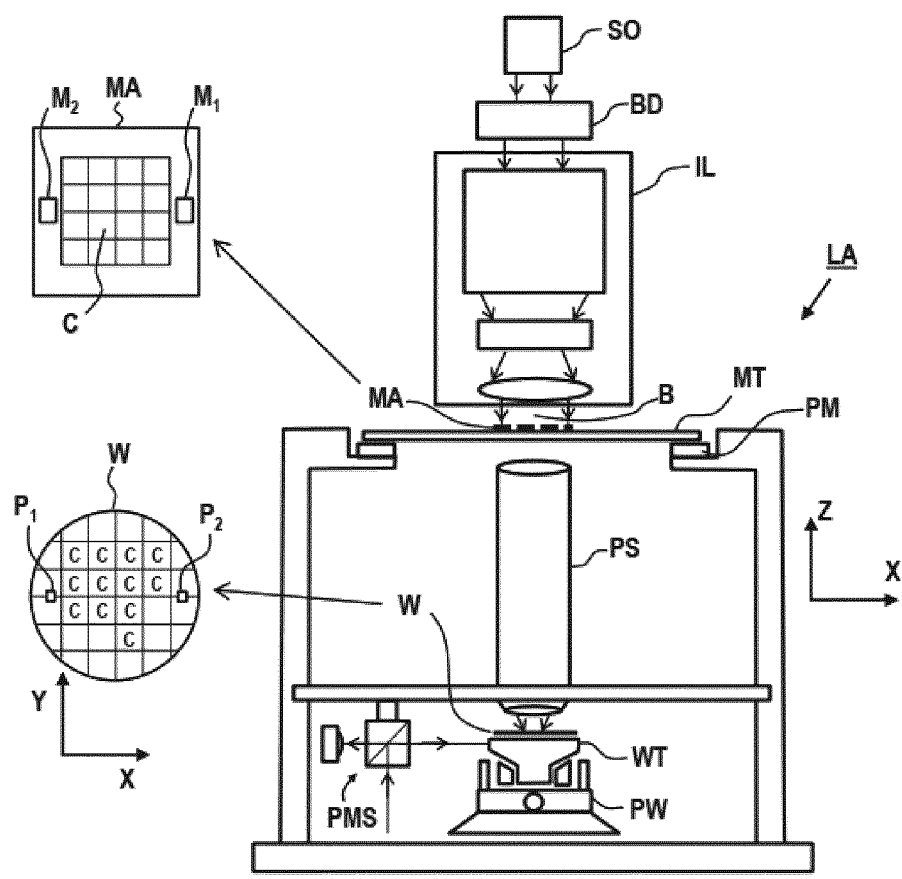
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W. In accordance with an embodiment of the present invention, the mask support MT and/or the substrate support WT of the lithographic apparatus LA can comprise an object table according to the present invention for holding a patterning device or a substrate respectively.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
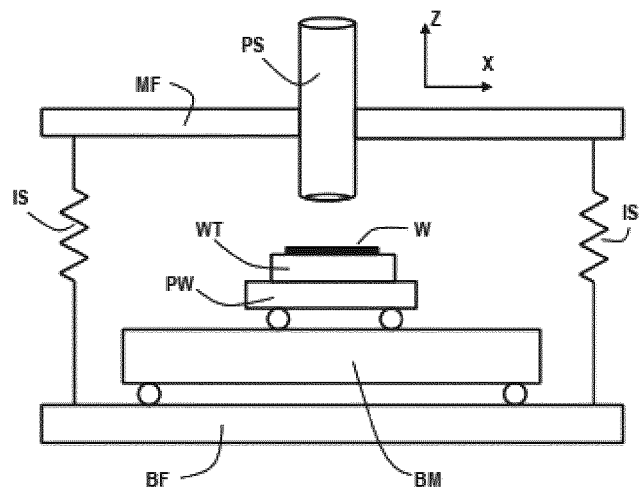
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor. a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
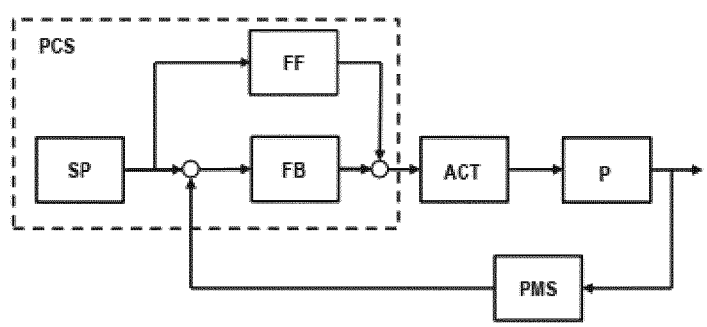
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

The present invention relates to an object table for holding an object. Such an object table according to the invention can e.g. be applied in a lithographic apparatus as described above, e.g. for holding a patterning device or a substrate.

Figure 4:
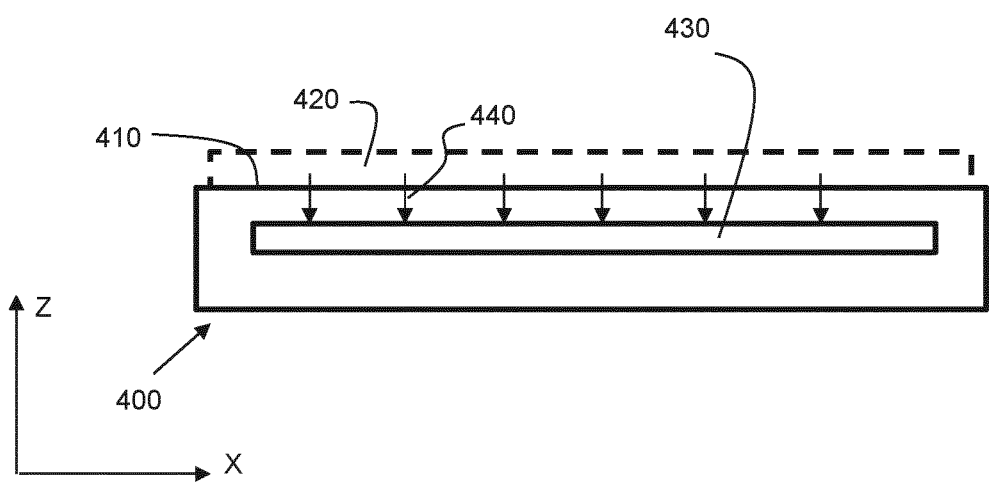
FIG. 4 depicts an object table according to an embodiment of the present invention.

FIG. 4 schematically shows an object table 400 according to an embodiment of the present invention. In accordance with the present invention, the object table 400 comprises a holding surface 410 for holding an object 420. In the embodiment as shown, the object 420 is positioned above the holding surface 410. It can however be pointed out that this need not be the case; the object 420 may also be, in an embodiment, arranged underneath the object table. in accordance with the present invention, the object table 400 further comprises an actuator arrangement 430 that is configured to exert a holding force, indicated by the arrows 440, on the object for holding the object 420 to the holding surface 410. In general, the holding force can also be referred to as a clamping force; such a clamping force is configured to attract the object 420 and hold it against the holding surface 410. In case the object 420 is located underneath the object table, the holding force 440 should at least be large enough to compensate for the weight of the object 420. The holding force as generated by the actuator arrangement 430 may also result in the generation of a friction force between the object 420 and the holding surface 410. Note that, when the object 420 is arranged on top of the object table, the weight of the object 420 will also, to some extent, contribute to the friction force. Such a friction force can e.g. avoid or mitigate a relative displacement between the object 420 and the holding surface 410 in case the object table 400 is displaced in a direction perpendicular to the direction of the holding force, e.g. in case the object table is displaced in the indicated X-direction.

Within the meaning of the present invention, an actuator arrangement configured to exert a holding force on an object is to be understood as any arrangement that can exert a force onto an object, said force being configured to hold or clamp the object to the holding surface. As will be detailed below, such an actuator arrangement can be implemented using various technologies, including but not limited to vacuum clamps or electrostatic clamps.

In accordance with the present invention, the actuator arrangement 430 of the object table 400 is further configured to decrease a strain in the object caused by the holding force by sequentially detaching and re-attaching portions of the object from the holding surface, while the object is held to the holding surface. It has been observed by the inventors that during the process of holding or clamping an object to an object table, the object may deform. This can e.g. be due to the fact that the holding force cannot be applied uniformly or at the same time across the holding surface. This may in particularly happen in case the object that is to be clamped is non-flat. As an example, the object may e.g. be a warped substrate. When such a warped or non-flat object is clamped, it may deform during the clamping process and thus remain in a deformed state when held onto the holding surface by the holding force.

It has been devised by the inventors that by sequentially detaching and re-attaching portions of the object 420 from the holding surface 410, the deformation of the object, or the strain in the object, can be mitigated.

In an embodiment of the present invention, the actuator arrangement is configured to sequentially detach and reattach different portions of the object from the holding surface in such manner that defined parts of the object have been detached and re-attached. In an embodiment, the defined parts of the object that are to be detached and re-attached substantially correspond to the entire object. In such embodiment, substantially the entire object will have been detached and re-attached from the holding surface when the sequence has been performed. In such embodiment, the sequence can e.g. comprise:

detaching and re-attaching an innermost portion of the object;

detaching and re-attaching a next portion adjacent to the innermost portion;

repeating the process of detaching and re-attaching a next portion until an outermost portion of the object is detached and re-attached.

When required, the sequence can be repeated several times. In an embodiment of the present invention, an innermost portion of the object that is held on the holding surface is not subjected to the process of detaching and re-attaching. Rather, the innermost portion, which can also be referred to as a central portion, remains held or clamped to the holding surface. By doing so, a displacement of the object relative to the holding surface, i.e. a re-centering of the object, can be avoided or maintained within acceptable limits.

It can be pointed out that, within the meaning of the present invention, detaching a portion of an object from a holding surface also includes substantially reducing the holding or clamping force acting on the portion, so as to relieve stress from the portion. As such, the process of detaching a portion from a holding surface does not actually require that there no longer is a contact between the portion and the holding surface. Once the holding or clamping force on the portion is sufficiently reduced, the portion can slip, i.e. displace, relative to the holding surface, thereby relieving stress from the object.

In order to sequentially detach and re-attach portions of the object from the holding surface, various options exist, as will be explained in more detail below.

Figure 5A:
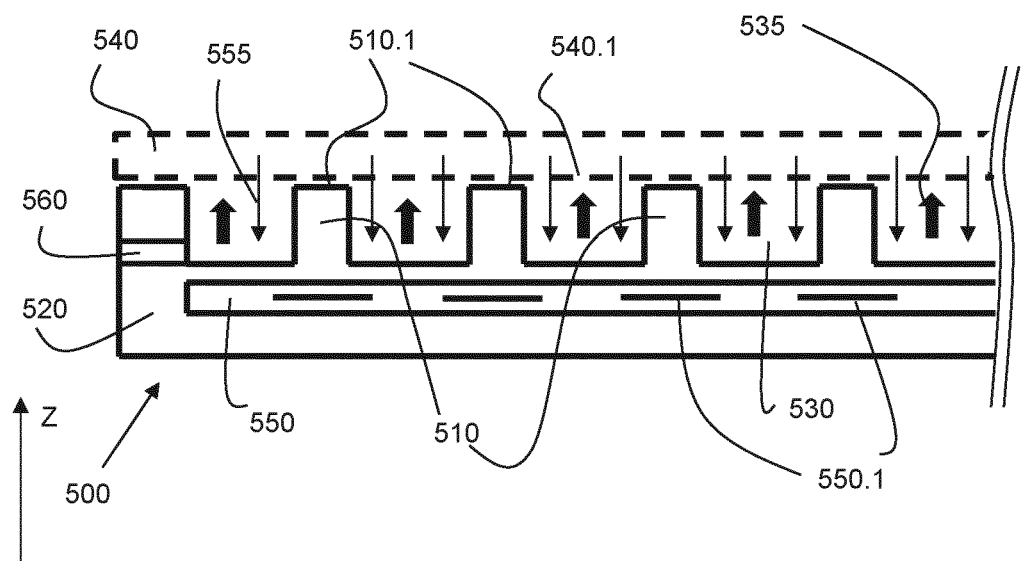
FIGS. 5a and 5b depict an object table according to another embodiment of the present invention.

FIG. 5a schematically shows part of an object table 500 according to an embodiment of the present invention. In the embodiment as shown, the object table 500 comprises a plurality of burls 510 protruding from a base plate 520 of the object table 500. In the embodiment as shown, the burls 510 are arranged in a recess 530 of the object table 500. The top surfaces of the burls 510 are configured to form a holding surface 510.1 for holding an object 540. Within the meaning of the present invention, the top surfaces of burls applied in an object table according to the invention may also be referred to as end surfaces of the burls. The object 540 can e.g. be a semiconductor substrate or a patterning device. In the embodiment as shown, the object table comprises a clamping arrangement 550 configured to exert a clamping force, indicated by the arrows 555, on the object 540. Such a clamping arrangement 550 can be considered an actuator arrangement or a part of an actuator arrangement within the meaning of the present invention. In the embodiment of FIG. 5a, the clamping arrangement 550 is an electrostatic clamping arrangement comprising one or more electrodes 550.1 that are configured to generate a clamping or holding force for holding the object to the holding surface 510.1 of the object table. Alternative clamping arrangements such as vacuum clamps or the like can be considered as well.

In the embodiment as shown, the object table 500 is further configured to receive a pressurized gas in the recess 530, when the object 540 is held on the holding surface 510.1. Such a pressurized gas may e.g. be provided via an inlet 560 to the recess 530. In this embodiment, pressurized gas refers to a gas at a pressure that is higher than an outside pressure, i.e. a pressure outside the recess. As such, the pressurized gas as supplied can be considered to exert a repelling force, indicated by the arrows 535, on the bottom surface 540.1 of the object 540, said force acting against the holding force 555 generated by the clamping arrangement. In such embodiment, the actual holding force acting on the object 540 can be considered as the combination of the clamping force 555 and the repelling force 535 generated by the pressurized gas. Since the pressurised gas contributes to this holding force acting on the object, a pressurized gas supply or pressurized gas arrangement providing such a pressurized gas can be considered part of the actuator arrangement of the object table according to the invention.

Figure 5B:
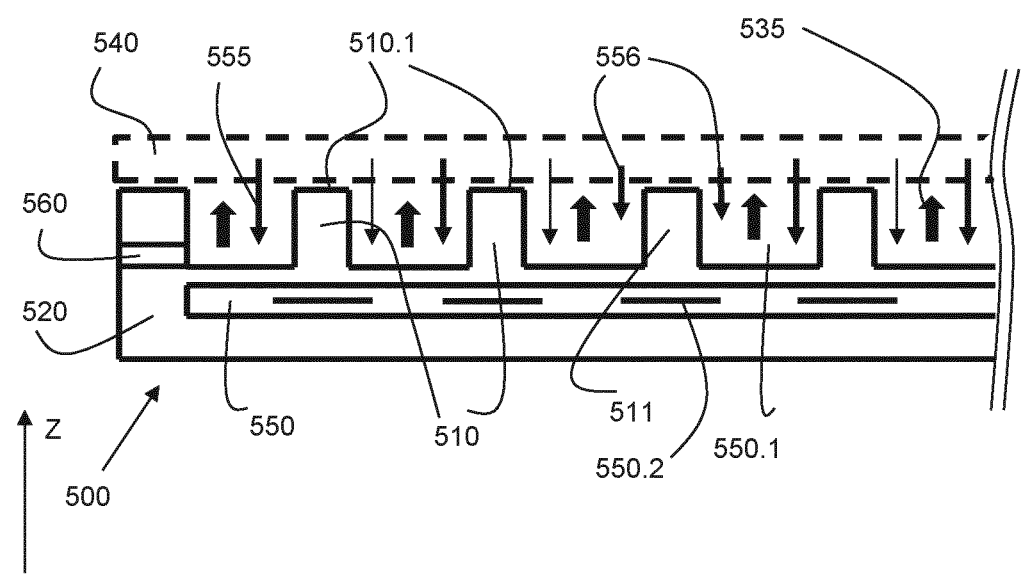

In accordance with the present invention, the actuator arrangement of the object table, in this case comprising the clamping arrangement and the pressurised gas arrangement, are further configured to sequentially detach and re-attach portions of the object from the holding surface 510.1. In the embodiment as shown, this can be realised by selectively de-energizing and re-energizing one or more electrodes of the electrostatic clamping arrangement. This is illustrated in FIG. 5b. By selectively de-energizing and re-energizing one or more electrodes of the electrostatic clamping mechanism, the clamping or holding force as generated can be temporarily reduced, in a local manner. Phrased differently, by selectively de-energizing one or more electrodes, these electrodes will result in a local decrease of the clamping force generated by the clamping arrangement. In particular the holding force acting on a portion of the object located above the de-energized one or more electrodes, will be reduced or become close to zero or become substantially equal to zero. By doing so, a portion of the object can detach or substantially detach from the holding surface 510.1, i.e. the portion of the object can be made to substantially disconnect from the burls 510 of the object table 500. In FIG. 5b, it is assumed that electrode 550.2 is de-energised, resulting in a reduced clamping force 556 in the portion of the object above said electrode, i.e. the portion of the object above burl 511. As a result of the reduced clamping force, the resulting force acting on the portion of the object above the electrode 550.2 may be directed upwards, rather than downwards. The portion of the object above the electrode 550.2 may thus be lifted upwards (not shown), resulting in said portion being detached from the holding surface, in particular the top surface or end surface of burl 511. As a result, the strain that may be present in said portion can be reduced because the portion is able, due to the detachment from the holding surface, to deform or displace relative to the holding surface.

It can be pointed out that, within the meaning of the present invention, detaching a portion of an object from a holding surface also includes substantially reducing the holding or clamping force acting on the portion, so as to relieve stress from the portion. As such, the process of detaching a portion from a holding surface does not actually require that there no longer is a contact between the portion and the holding surface. Once the holding or clamping force on the portion is sufficiently reduced, the portion can slip, i.e. displace, relative to the holding surface, thereby relieving stress from the object.

In an embodiment of the present invention, the electrodes as applied in a clamping mechanism or clamping arrangement are arranged concentrically and have a similar shape as the object that is held. In an embodiment, the object to be clamped is a rectangular patterning device. In such case, the electrodes can e.g. have a rectangular shape. In case the object to be clamped is a semiconductor substrate, the electrodes can e.g. be ring shaped electrodes. Note that the ring shaped electrodes may also be segmented to allow a more detailed selection of which portion of the object is to be detached.

Once the strain in the detached portion of the object is released or reduced, said portion can be clamped again by energizing the electrode 550.2 again. The process may then be repeated by de-energizing and re-energizing another electrode of the clamping arrangement 550, in order to detach and re-attach another portion of the object from the holding surface. Note that there may be an overlap between the portion previously detached and the new portion that is being detached.

FIGS. 5a and 5b schematically illustrate a first manner how to selectively detach and re-attach a portion of an object from a holding surface.

Figure 6A:
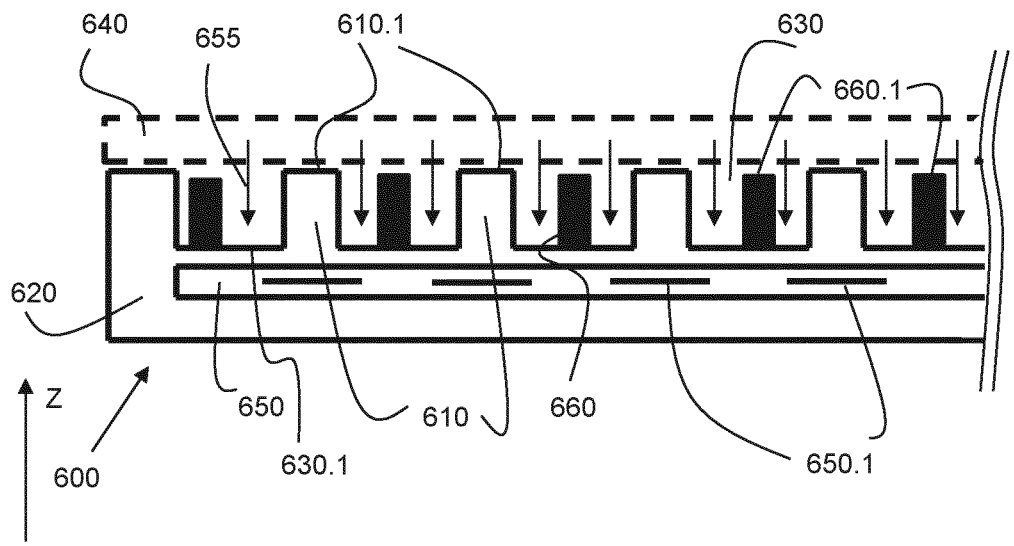
FIGS. 6a and 6b depict an object table according to an embodiment of the present invention.

FIG. 6a schematically shows another embodiment of an object table 600 according to the present invention. In the embodiment as shown, the object table 600 comprises a plurality of burls 610 protruding from a base plate 620 of the object table 600. Note that the base plate 620 and the burls 610 can be made from a single piece structure. In the embodiment as shown, the burls 610 are arranged in a recess 630 of the object table 600. The top surfaces or end surfaces of the burls 610 are configured to form a holding surface 610.1 for holding an object 640. The object 640 can e.g. be a semiconductor substrate or a patterning device. In the embodiment as shown, the object table 600 comprises a clamping arrangement 650 configured to exert a clamping force, indicated by the arrows 655, on the object 640. Such a clamping arrangement 650 can be considered an actuator arrangement or a part of an actuator arrangement within the meaning of the present invention. In the embodiment of FIG. 6a, the clamping arrangement 650 is an electrostatic clamping arrangement comprising one or more electrodes 650.1 that are configured to generate a clamping or holding force for holding the object to the holding surface 610.1 of the object table. Alternative clamping arrangements such as vacuum clamps or the like can be considered as well.

Figure 6B:
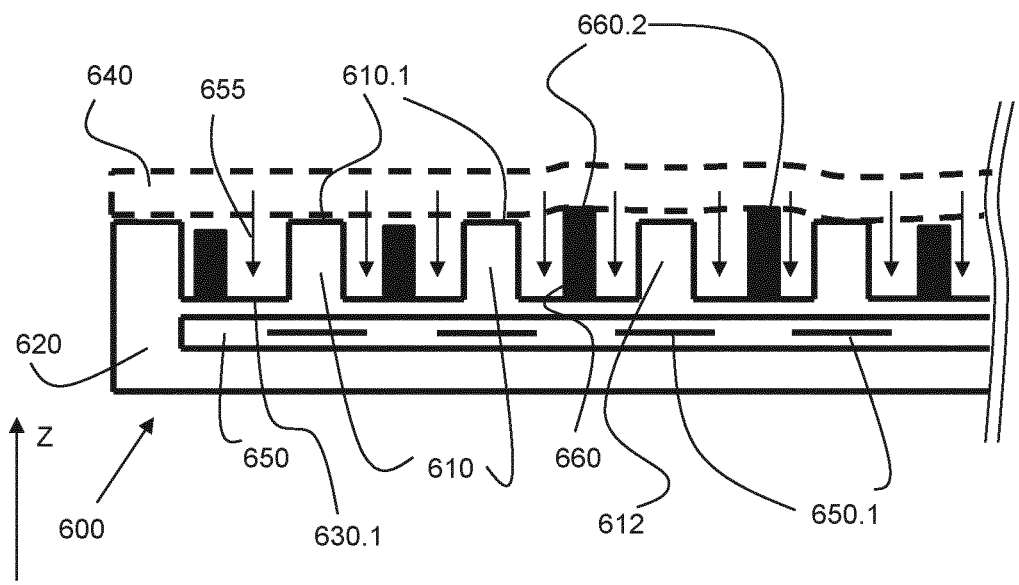

In the embodiment as shown, the object table 600 further comprises a plurality of actuators 660 that are distributed across the bottom surface 630.1 of the recess 630. Such a plurality of actuators can e.g. be arranged in between the burls 610 of the object table 600. In the embodiment as shown, the plurality of actuators 660 comprises piezoelectric actuators that are configured to elongate, in the Z-direction, when energized. In particular, the piezo-electric actuators 660 are configured such that their top surfaces 660.1 remain below the holding surface 610.1 when they are not energized and are configured such that their top surfaces 660.1 extend beyond the holding surface 610.1 when they are energized. FIG. 6b schematically shows the object table 600 of FIG. 6a, when two of the actuators 660, indicated as actuators 660.2, are energized. As can be seen, the actuators 660.2 are arranged adjacent burl 612 and, when energized, they extend beyond the holding surface formed by the end surfaces 610.1 of the burls. As a result, the object 640 is locally lifted from the holding surface, in particular the top surface of burl 612 such that a portion of the object is detached from the holding surface.

As an alternative to the use of piezo-electric actuators, other types of actuators can be considered as well. As an example, electrostatic actuators or electromagnetic actuators can be considered. Magnetostrictive actuators can be considered as well.

Figure 7:
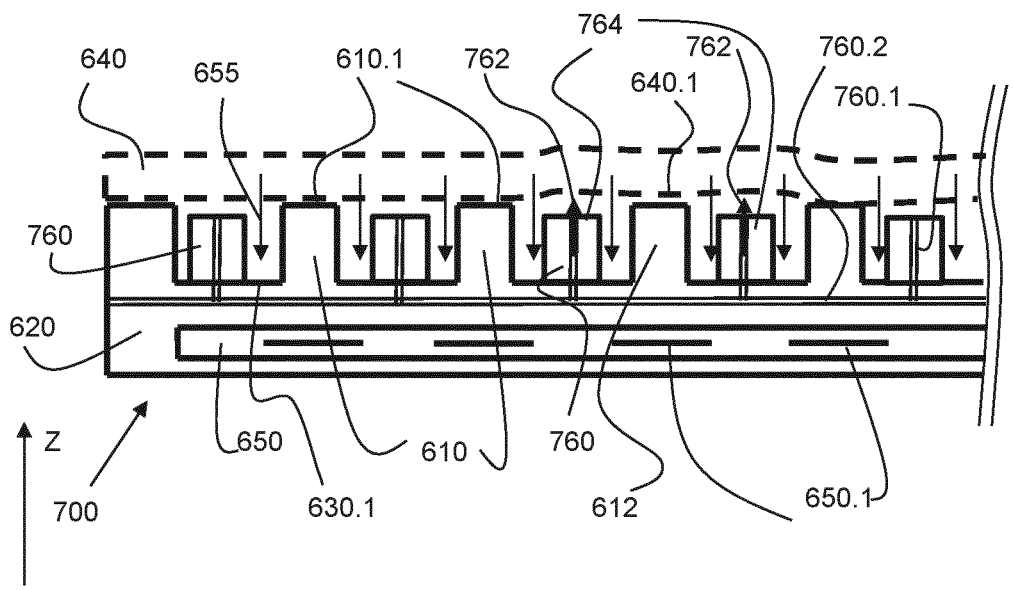
FIGS. 7 to 10 depict object tables according to other embodiments of the present invention.

In an embodiment of the present invention, the plurality of actuators as applied are pneumatic actuators. In accordance with the present invention, such pneumatic actuators are configured to selectively supply a gas flow to a portion of the object in order to detach said portion from the holding surface. FIG. 7 schematically shows such an arrangement. FIG. 7 schematically shows an object table 700 according to the present invention that corresponds to object table 600 shown in FIGS. 6a and 6b apart from the following: instead of piezo-electric actuators 660, the plurality of actuators as applied in the object table 700 are pneumatic actuators 760, the actuators being distributed across the bottom surface 630.1 of the object table 700. The pneumatic actuators are configured to supply a gas flow to the object, to selectively exert the repelling force onto the object. In the embodiment as shown, the plurality of actuators 760 are provided with channels or ducts 760.1 for receiving a flow of gas, e.g. from an inlet duct 760.2 and for outputting the flow of gas towards a surface 640.1 of the object that faces the holding surface 610.1. By selectively activating the pneumatic actuators, i.e. by selectively enabling a flow of gas to flow through a subset of the actuators 760 (e.g. by activating and deactivating valves and/or using the separate channels or ducts), a portion of the object 640 can be made to detach from the holding surface. In FIG. 7, pneumatic actuators 764 are activated and thus provide a gas flow, indicated by the arrows 762, that generates a repelling force onto a portion of the object, so as to detach the portion of the object from the holding surface. In particular, as can be seen in FIG. 7, the actuation of the pneumatic actuators 764, which are arranged adjacent burl 612, results in a detachment of a portion of the object 640 from the holding surface, in particular the end surface or top surface of the burl 612.

Figure 8:
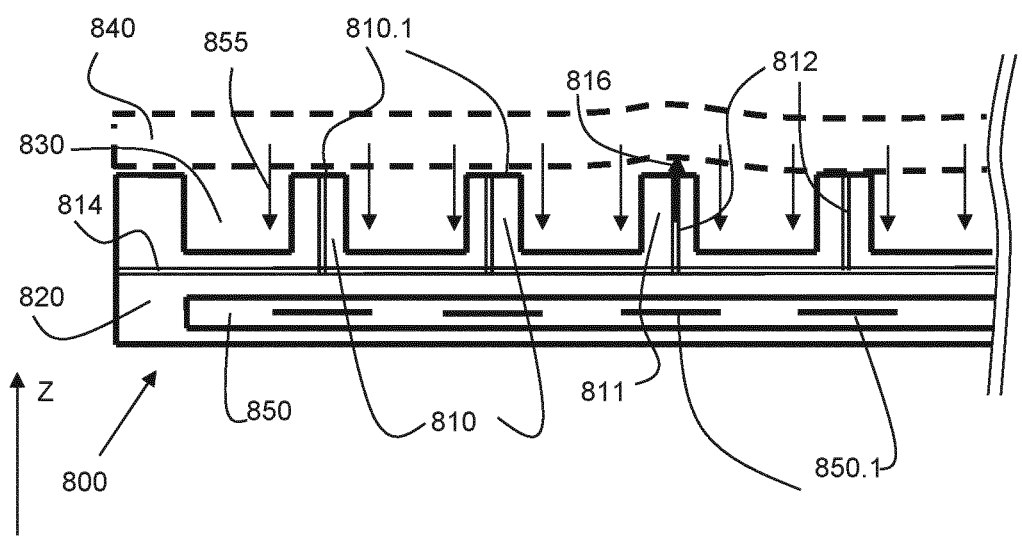

FIG. 8 schematically shows yet another embodiment of an object table 800 according to the present invention. FIG. 8 schematically shows an object table 800 according to the present invention that corresponds to object table 700 shown in FIG. 7 apart from the following: Instead of having dedicated pneumatic actuators 760 arranged in between the burls 610 of the object table, the object table 800 comprises a plurality of pneumatic actuators that are integrated in the burls of the object table. As schematically shown, the object table 800 comprises a plurality of burls 810 protruding from a base plate 820 of the object table 800. In an embodiment, the base plate 820 and the burls 810 can be made from a single piece structure. In the embodiment as shown, the burls 810 are arranged in a recess 830 of the object table 800. The top surfaces or end surfaces of the burls 810 are configured to form a holding surface 810.1 for holding an object 840. The object 840 can e.g. be a semiconductor substrate or a patterning device. In the embodiment as shown, the object table comprises a clamping arrangement 850 configured to exert a clamping force, indicated by the arrows 855, on the object 840. Such a clamping arrangement 850 can be considered as an actuator arrangement or a part of an actuator arrangement within the meaning of the present invention. In the embodiment of FIG. 8, the clamping arrangement 850 is an electrostatic clamping arrangement comprising one or more electrodes 850.1 that are configured to generate a clamping or holding force for holding the object to the holding surface 810.1 of the object table. Alternative clamping arrangement such as vacuum clamps or the like can be considered as well. In the embodiment as shown in FIG. 8, the actuator arrangement of the object table 800 further comprises a plurality of pneumatic actuators that are integrated in the burls 810. In particular, the burls 810 are provided with channels or ducts 812 for receiving a flow of gas, e.g. from an inlet duct 814 and for outputting the flow of gas from the end surfaces 810.1 of the burls 810 towards a surface of the object that faces the holding surface 810.1, i.e. the top surfaces of the burls. The burls 810 in the embodiment as shown thus serve both as burls providing a holding surface for the object 840 and as actuators. By selectively activating the pneumatic actuators integrated in the burls 810, i.e. by selectively enabling a flow of gas to flow through a subset of the pneumatic actuators/burls 810, a portion of the object 840 can be made to detach from the holding surface. In FIG. 8, the pneumatic actuator associated with burl 811 is activated and thus provides a gas flow, indicated by the arrow 816, that generates a repelling force onto a portion of the object 840, so as to detach the portion of the object from the holding surface. In particular, as can be seen in FIG. 8, the actuation of the pneumatic actuator associated with burl 811 results in a detachment of a portion of the object 840 from the holding surface, in particular from the top surface of the burl 811. It can be pointed out that, in an embodiment, not all burls protruding from the base plate need to be provided with an integrated pneumatic actuator. It may be sufficient that only a subset of the burls is provided with pneumatic actuators.

Figure 9:
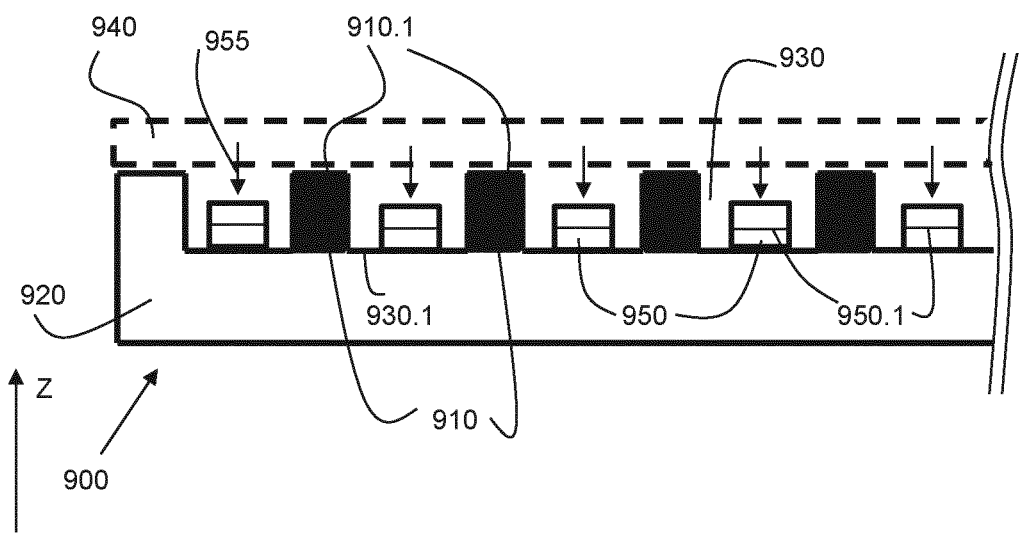

FIG. 9 schematically shows yet another embodiment of an object table 900 according to the present invention. In the embodiment as shown, the object table 900 comprises a plurality of actuatable burls 910 mounted to a base plate 920 of the object table 900. In the embodiment as shown, the actuatable burls 910 are arranged in a recess 930 of the object table 900. Compared to the embodiment as shown in FIGS. 6a and 6b, the burls 910 themselves can be actuated. In particular, the burls 910 can comprise piezo-electric actuators or the like to enable the burls to contract or elongate in the indicated Z-direction. The top surfaces or end surfaces of the actuatable burls 910 are configured to form a holding surface 910.1 for holding an object 940. The object 940 can e.g. be a semiconductor substrate or a patterning device. In the embodiment as shown, the object table further comprises a clamping arrangement 950 configured to exert a clamping force, indicated by the arrows 955, on the object 940. In the embodiment of FIG. 9, the clamping arrangement 950 is an electrostatic clamping arrangement comprising one or more electrodes 950.1 that are configured to generate a clamping or holding force for holding the object to the holding surface 910.1 of the object table. The electrostatic clamping arrangement 950 as schematically shown has a different lay-out as the clamping arrangement 650 in FIGS. 6a and 6b; rather than having the electrodes embedded in the base plate of the object table, the electrodes 950.1 of the clamping arrangement 950 are arranged in between the burls, i.e. the actuatable burls 910, on the bottom surface 930.1 of the recess 930. Such a clamping arrangement whereby the electrodes are arranged above the base plate 920 can be used instead of the clamping arrangement 650 of FIGS. 6a and 6b, or can be combined with it. Alternative clamping arrangement such as vacuum clamps or the like can be considered as well. In the embodiment as shown in FIG. 9, the burls 910, which end surfaces 910.1 form the support surface for the object 940, are actuatable. In particular, they can be made to contract, when energized. By selectively doing so, portions of the object 940 can be detached and re-attached from the holding surface, thereby relieving stress or strain from the object.

Figure 10:
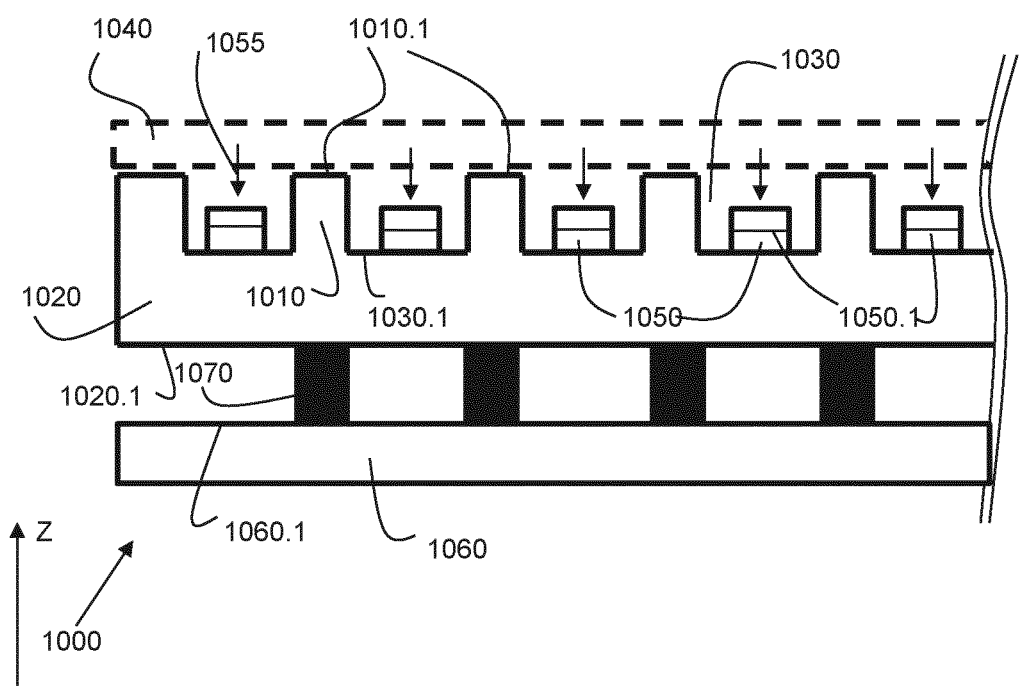

FIG. 10 schematically shows yet another embodiment of an object table according to the present invention. The object table 1000 in the embodiment as shown comprises a plurality of burls 1010 mounted to a base plate 1020 of the object table 1000. In the embodiment as shown, the burls 1010 are arranged in a recess 1030 of the object table 1000. The top surfaces or end surfaces of the burls 1010 are configured to form a holding surface 1010.1 for holding an object 1040. The object 1040 can e.g. be a semiconductor substrate or a patterning device. In the embodiment as shown, the object table further comprises a clamping arrangement 1050 configured to exert a clamping force, indicated by the arrows 1055, on the object 1040. The clamping arrangement 1050 is similar to the clamping arrangement of FIG. 9; the clamping arrangement 1050 is an electrostatic clamping arrangement comprising one or more electrodes 1050.1 that are configured to generate a clamping or holding force for holding the object to the holding surface 1010.1 of the object table. In the embodiment as shown, the object table 1000 further comprises a further base plate 1060 and a plurality of actuators 1070 arranged between the base plate 1020 and the further base plate 1060. In the embodiment as shown, the plurality of actuators 1070 are connected to the surfaces 1020.1 and 1060.1 of the base plate 1020 and further base plate 1060 that face each other. In the embodiment as shown, the actuators 1070 are configured to deform when energized or actuated. In particular, the actuators 1070 are configured to contract or elongate, depending on the actuation. By selectively energizing one or more of the actuators 1070, the base plate 1020 and the burls 1010, said burls forming the holding surface 1010.1 for the object 1040, can be made to selectively deform. Due to said selective deformation, portions of the object 1040 can be detached and re-attached from the holding surface, thereby relieving stress or strain from the object.

Generalizing the process of detaching and re-attaching a portion of an object that is held on a holding surface, one can understand that in order to detach a portion of the object that is held on a holding surface by a holding force from said holding surface, one can either:
- locally reduce or reverse the holding force such that the desired portion of the object is repelled from the holding surface,
- deform the holding surface such that the desired portion of the object no longer contacts the holding surface, or
- deforming the object such that the desired portion of the object no longer contacts the holding surface.

FIG. 11 schematically illustrates in more detail the process of sequentially detaching and re-attaching portions of the object from the holding surface, in order to relieve or reduce a strain of the object. FIG. 11 a schematically shows part of an object 1140 clamped on an object table 1100 according to the present invention, the object table 1100 comprising a plurality of burls 1110 protruding from a base plate 1120 from the object table 1100. The object 1140 as illustrated can e.g. be a disc-shaped object such as a semiconductor substrate, the object 1140 having an axis of symmetry. For clarity reasons, the clamping arrangements and actuators as applied in the actuator arrangement of the object table are not shown. It is assumed that during the clamping process of the object 1140 onto the holding surface formed by the end surfaces 1110.1, the object has undergone a deformation. In addition, as can be seen in FIG. 11a, the burls 1110 have also undergone a deformation. In the arrangement as shown, the burls 1110 are considered to be deflected radially inward. Due to the friction force between the burls and the object, said deformations are maintained.

FIGS. 11b to 11g illustrate the effects of a sequential process or sequence of detaching and re-attaching portions of the object from the holding surface of the object. In the sequence as shown a radially outward propagation is applied to the particular portions that are detached and re-attached.

Figure 11A:
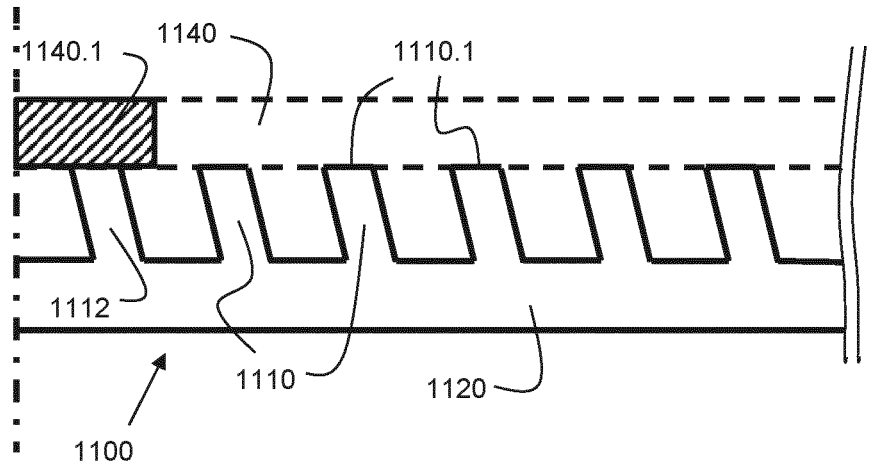
FIGS. 11a to 11g depict a process of sequentially detaching and re-attaching different portions of an object table according to an embodiment of the present invention.
Figure 11B:
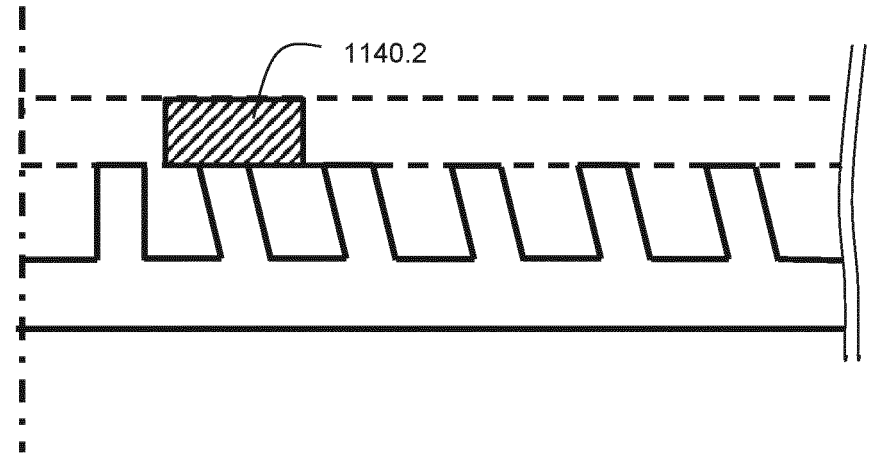
Figure 11C:
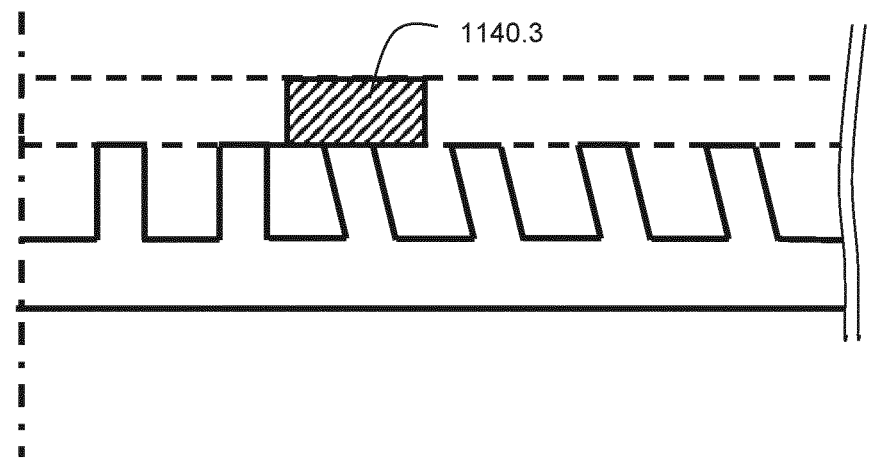
Figure 11D:
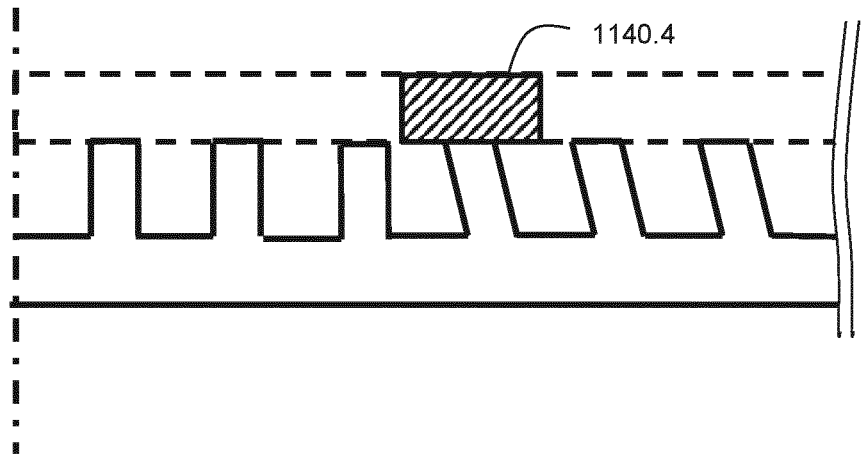
Figure 11E:
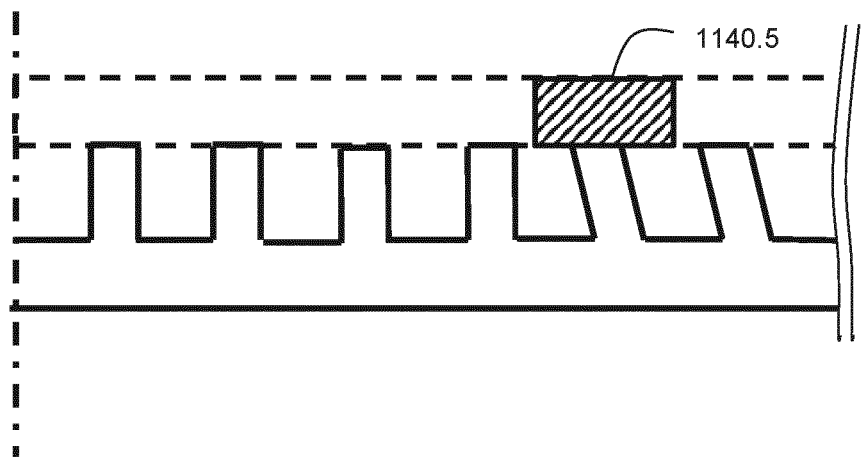
Figure 11F:
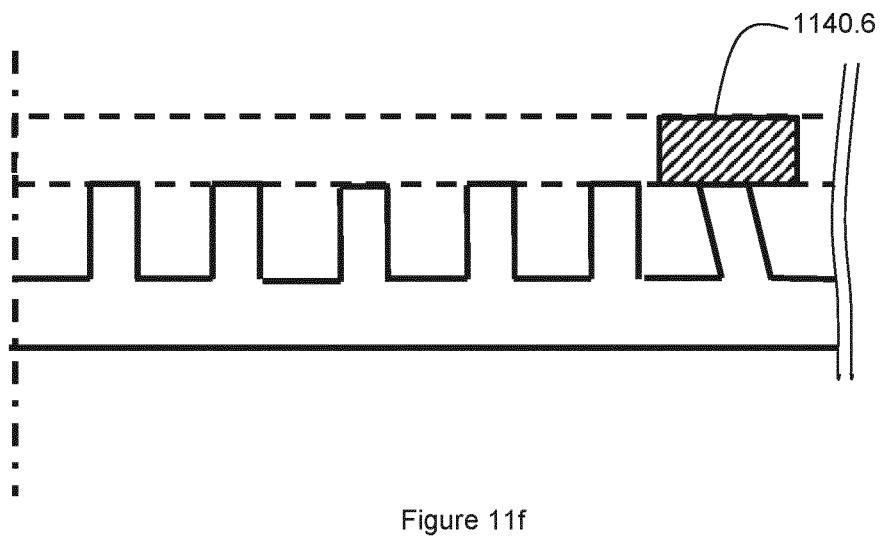

In particular, in order to transition from the state illustrated in FIG. 11a to the state illustrated in FIG. 11b, an innermost portion 1140.1 of the object 1140 is detached and subsequently re-attached from the object table 1100. In the embodiment as shown, the innermost portion 1140.1 is associated with the burl 1112. As illustrated in FIG. 11b, the temporarily detaching of the burl 1112 from the object 1140 enables the burl 1112 to return to its un-deformed state. Similarly, due to the temporarily detachment of the portion 1140.1, any stress or strain of said portion can be relieved as well.

With respect to the detachment and re-attachment of the portion 1140.1, it will be clear to the skilled person that such detachment and re-attachment can be realised using any of the mechanisms described in FIGS. 5a to 10, i.e. by either locally reducing the holding force and/or deforming the holding surface and/or the object so as to detach a portion of the object from the holding surface.

Figure 11G:
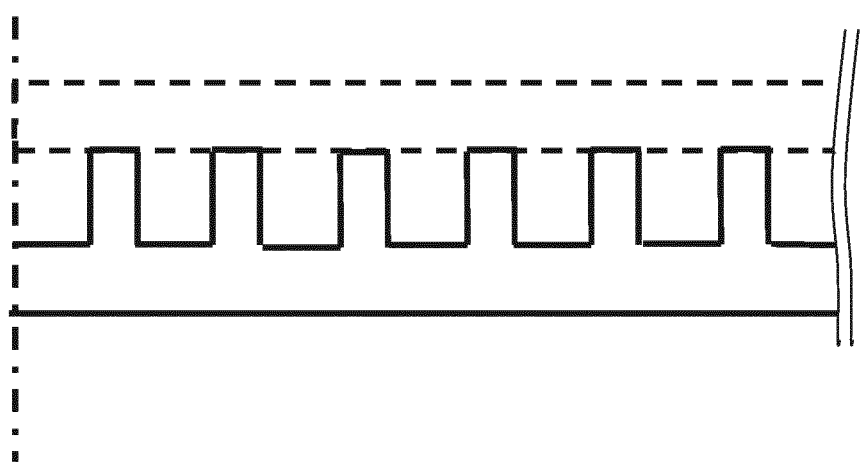

FIGS. 11b to 11g illustrate a propagation, a radially outward propagation, of the process of detaching and re-attaching different portions of the object. In particular, the FIGS. 11b to 11g illustrate the different portions 1140.2 to 1140.6 that are sequentially detached and re-attached resulting in a stress or strain relieve in both the burls 1110 and the object 1140. FIG. 11g thus illustrates that state of the burls 1140 when all portions have been processed. In an embodiment, the process of detaching and re-attaching portions of the object is continued until an outermost portion of the object is reached.

FIGS. 11a to 11g thus illustrate an embodiment of a process of
- detaching and re-attaching an innermost portion 1140.1 of an object from a holding surface;
- detaching and re-attaching a next portion adjacent to the innermost portion;
- repeating the process of detaching and re-attaching a next portion until an outermost portion of the different portions is detached and re-attached.

In an embodiment, such a process is repeated multiple times. It has been observed that it may be required to perform the process several times to sufficiently reduce the strain that has occurred in the object due to the holding or clamping of the object onto the holding surface. In an embodiment, the number of times that the illustrated process is repeated can e.g. be predetermined, e.g. based on empirical data or experiments or based on simulations.

In an embodiment of the present invention, the object table is configured to detect whether or not a strain is present in the object that is held on the holding surface. Such a detection can e.g. be realised using strain sensors or the like.

Such sensors can e.g. detect a strain in the burls of the object table when considering that a strain in one or more of the burls can be considered an indication of the strain in the object that is held. In an embodiment of the present invention, piezo-electric transducers are applied to sense a strain in one or more of the burls as applied. In this respect, it can be pointed out that, in general, a piezo-electric actuator may also be applied as a piezo-electric sensor. As such, the actuatable burls such as burls 910 shown in FIG. 9, whereby the actuatable burls 910 include piezo-electric actuators for actuating the burls can also be used as sensors to identify the presence of a stress or strain in the object.

In an embodiment of the present invention, the object table further comprises a control unit for controlling the actuator arrangement of the object table. Such a control unit can e.g. be configured to control the clamping arrangement as applied and/or the plurality of actuators as applied in the object table, in order for the actuator arrangement to perform the required sequential detaching and re-attaching of the different portions of the object from the object table. In particular, the control unit can e.g. be configured to control in which order the portions of the object need to be detached and re-attached to the holding surface. In this respect, it can be pointed out that the order in which different portions of the object are detached and re-attached may depend on the initial shape of the object that is held. In particular in case the object is a semiconductor substrate, there are various ways in which a substrate can deform. A semiconductor substrate is typically subjected to a plurality of different processes and as a result, become deformed to a certain extend. Such a deformed substrate is in general referred to as a warped substrate. Examples of the warpage or deformation of a substrate e.g. include an umbrella shape, a bowl shape or a saddle shape. Depending on the warpage of the substrate, or the object in general, the preferred sequence of portions of the object that are detached and re-attached may be different. In FIGS. 11*a* to 11*g*, a radially outward propagations of the detached and reattached portions is illustrated. Alternatively, a radially inward propagation or an azimuthal propagation, or a combination of different propagations can be implemented. As such, in an embodiment of the present invention, the shape of the object that is held or clamped is taken into account when determining in which order or sequence, different portions of the object are to be detached and re-attached. In such embodiment, the object table according to the present invention can comprise a control unit that is configured to receive an input signal representative of a shape of the object that is being held or that is to be held by the object table. Based on said input signal, the control unit can then control the sequence in which different portions of the object are detached and re-attached.

In an embodiment of the present invention, the object table according to the present invention is applied in a stage apparatus. Such a stage apparatus can e.g. comprises an object table according to the present invention and a positioning device or positioner for positioning the object table. Such a positioning device or positioner can e.g. be a positioner PM or positioner PW as applied in a lithographic apparatus illustrated in FIGS. 1 to 3.

In an embodiment of the present invention, the object table according to the present invention or the stage apparatus according to the present invention is applied in a lithographic apparatus.

Figure 12:
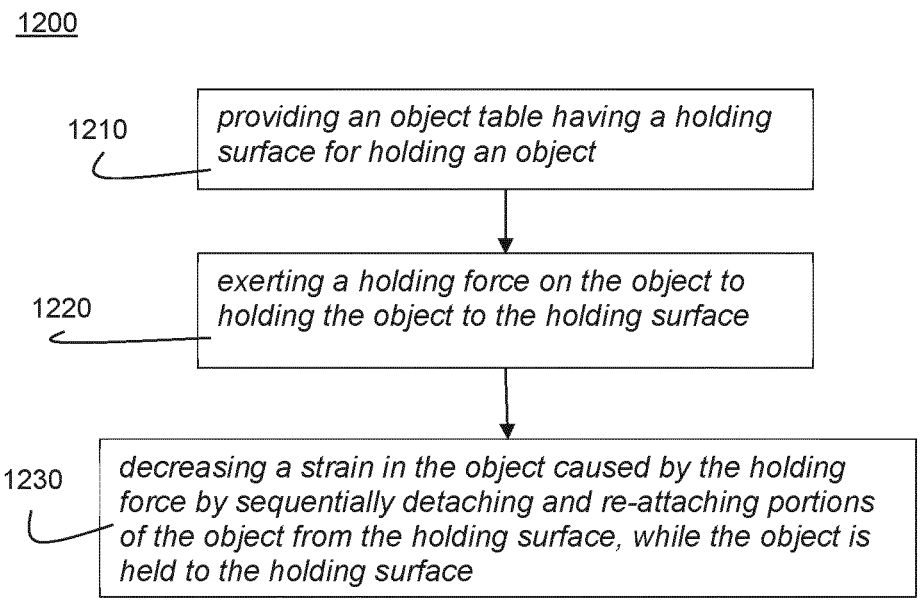
FIG. 12 depicts a flowchart of a method according to the present invention.

In accordance with an aspect of the present invention, there is provided a method of holding an object to a holding surface of an object table. FIG. 12 schematically shows a flowchart 1200 of such a method.

In accordance with the present invention, the method comprises a first step 1210 of providing an object table having a holding surface for holding an object.

In a second step 1220, the method comprises the step of exerting a holding force on the object to hold the object to the holding surface.

In a third step 1230, the method comprises the step of decreasing a strain in the object caused by the holding force by sequentially detaching and re-attaching portions of the object from the holding surface, while the object is held to the holding surface.

With respect to the third step 1230, it can be pointed out that the process of detaching and re-attaching a portion of an object that is held on a holding surface can be executed in various manners. In particular, one can either:

locally reduce or reverse the holding force such that the desired portion of the object is repelled from the holding surface, deform the holding surface such that the desired portion of the object no longer contacts the holding surface, or deforming the object such that the desired portion of the object no longer contacts the holding surface, or a combination of these manners.

In an embodiment, the object table as provided in step 1210 of the method according to the present invention comprises an object table according to the invention.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An object table comprising:
a holding surface configured to hold an object; and
an actuator arrangement configured to exert a holding force on the object for holding the object to the holding surface, wherein the actuator arrangement is further configured to decrease a strain in the object caused by the holding force by sequentially detaching and re-attaching portions of the object from the holding surface, while the object is held to the holding surface, by selectively adjusting the holding force on the object and by applying a force on the object that has at least a force component in a direction opposite a direction of the holding force and/or displacing at least part of the holding surface away from the object.

2. The object table according to claim 1, further comprising a base plate and a plurality of burls protruding from the base plate, and wherein the holding surface comprises end surfaces of the plurality of burls.

3. The object table according to claim 1, wherein the actuator arrangement comprises a clamping arrangement configured to exert the holding force on the object.

4. The object table according to claim 3, wherein the clamping arrangement is configured to selectively reduce a local holding force exerted on a portion of the object.

5. The object table according to claim 4, wherein the reduction of the local holding force is configured to cause the portion of the object to detach from the holding surface.

6. The object table according to claim 3, wherein the clamping arrangement comprises an electrostatic clamping arrangement comprising a plurality of separate electrodes.

7. The object table according to claim 6, wherein the electrostatic clamping arrangement is configured to selectively reduce a local holding force exerted on a portion of the object by selectively de-energizing and re-energizing one or more electrodes of the plurality of electrodes.

8. The object table according to claim 2, wherein the actuator arrangement comprises a plurality of actuators mounted to the base plate.

9. The object table according to claim 8, wherein the actuator arrangement is configured to:
activate a first subset of the plurality of actuators to detach a first portion of the support surface from the object,
deactivate the first subset of the plurality of actuators to re-attach the first portion of the support surface to the object,
activate a second subset of the plurality of actuators to detach a second portion of the support surface from the object,
deactivate the second subset of the plurality of actuators to re-attach the second portion of the support surface to the object.

10. The object table according to claim 8, wherein the actuators comprise piezo-electric actuators or pneumatic actuators.

11. The object table according to claim 2, wherein the plurality of burls comprises a plurality of actuatable burls, the actuatable burls comprising a respective plurality of actuators.

12. The object table according to claim 11, wherein the actuator arrangement comprises a clamping arrangement configured to exert the holding force on the object.

13. The object table according to claim 11, wherein the actuatable burls are configured to sequentially detach and re-attach portions of the object from the holding surface by contracting and elongating.

14. The object table according to claim 13, wherein the actuatable burls comprise piezo-electric actuators.

15. The object table according to claim 1, wherein the actuator arrangement is configured to sequentially detach and reattach the portions of the object from the holding surface by:
detaching and re-attaching an innermost portion of the portions
detaching and re-attaching a next portion adjacent to the innermost portion; and
repeating the process of detaching and re-attaching a next portion until an outermost portion of the portions is detached and re-attached.

16. The object table according to claim 1, further comprising a control unit configured to control an operation of the actuator arrangement.

17. A stage apparatus comprising the object table according to claim 1 and a positioning device configured to position the object table.

18. A lithographic apparatus comprising the stage apparatus according to claim 17.

19. A method of holding an object to a holding surface of an object table, the method comprising:
exerting a holding force on the object to hold the object to the holding surface; and
decreasing a strain in the object caused by the holding force by sequentially detaching and re-attaching portions of the object from the holding surface, while the object is held to the holding surface, by selectively adjusting the holding force on the object and by applying a force on the object that has at least a force component in a direction opposite a direction of the holding force and/or displacing at least part of the holding surface away from the object.

20. The method according to claim 19, wherein the object table comprises:
a holding surface configured to hold the object;
an actuator arrangement configured to exert a holding force on the object for holding the object to the holding surface, wherein the actuator arrangement is further configured to decrease the strain in the object caused by the holding force by sequentially detaching and re-attaching portions of the object from the holding surface, while the object is held to the holding surface, by selectively adjusting the holding force on the object.

* * * * *